(12) United States Patent
Funaki et al.

(10) Patent No.: US 8,361,605 B2
(45) Date of Patent: Jan. 29, 2013

(54) PHOTOSENSITIVE RESIN COMPOSITION, DRY FILM, AND PROCESSED PRODUCT MADE USING THE SAME

(75) Inventors: Katsuhiko Funaki, Sunnyvale, CA (US); Etsuo Ohkawado, Chiba (JP); Kousuke Hirota, Urayasu (JP); Syuji Tahara, Ichihara (JP)

(73) Assignee: Mitsui Chemicals, Inc., Tokyo (JP)

( * ) Notice: Subject to any disclaimer, the term of this patent is extended or adjusted under 35 U.S.C. 154(b) by 551 days.

(21) Appl. No.: 12/596,948

(22) PCT Filed: Apr. 23, 2008

(86) PCT No.: PCT/JP2008/001064
§ 371 (c)(1),
(2), (4) Date: Oct. 21, 2009

(87) PCT Pub. No.: WO2008/132843
PCT Pub. Date: Nov. 6, 2008

(65) Prior Publication Data
US 2010/0116532 A1    May 13, 2010

(30) Foreign Application Priority Data

Apr. 24, 2007  (JP) ................. 2007-113664

(51) Int. Cl.
G03F 7/004  (2006.01)
G03F 7/037  (2006.01)
H05K 3/28   (2006.01)
B32B 27/16  (2006.01)
B32B 27/18  (2006.01)

(52) U.S. Cl. ............ 428/209; 430/270.1; 430/281.1; 430/311; 430/319; 522/16; 522/26; 522/56; 522/63

(58) Field of Classification Search .......... 430/281.1, 430/283.1, 286.1, 287.1, 311, 319; 428/209; 522/16, 26, 56, 63, 135, 142
See application file for complete search history.

(56) References Cited

U.S. PATENT DOCUMENTS

| | | | | |
|---|---|---|---|---|
| 4,778,859 A * | 10/1988 | Ai et al. | ........ | 525/421 |
| 4,963,645 A * | 10/1990 | Inoue et al. | ........ | 528/342 |
| 5,326,792 A * | 7/1994 | Masaki et al. | ........ | 522/135 |
| 5,756,260 A * | 5/1998 | Sashida et al. | ........ | 430/283.1 |
| 6,610,815 B1 * | 8/2003 | Hata et al. | ........ | 528/310 |
| 7,851,124 B2 * | 12/2010 | Funaki et al. | ........ | 430/270.1 |
| 2003/0216514 A1 | 11/2003 | Nishikubo et al. | | |
| 2004/0247908 A1 * | 12/2004 | Funaki et al. | ........ | 428/473.5 |
| 2005/0170270 A1 * | 8/2005 | Funaki et al. | ........ | 430/57.3 |
| 2010/0059263 A1 * | 3/2010 | Funaki et al. | ........ | 174/258 |
| 2010/0116532 A1 * | 5/2010 | Funaki et al. | ........ | 174/258 |

FOREIGN PATENT DOCUMENTS

| | | |
|---|---|---|
| CN | 1478219 A | 2/2004 |
| CN | 1755524 A | 4/2006 |
| JP | 2000-321767 A | 11/2000 |
| JP | 2001-163936 A | 6/2001 |
| JP | 2005-208527 A | 8/2005 |
| JP | 2005-266757 A | 9/2005 |
| JP | 2006-227387 A | 8/2006 |
| JP | 2006-330193 A | 12/2006 |
| JP | 2006-342310 A | 12/2006 |
| JP | 2007-94342 A | 4/2007 |
| JP | 2007-94428 A | 4/2007 |
| WO | WO 02/24774 A1 | 3/2002 |
| WO | WO 03/059975 A1 | 7/2003 |

OTHER PUBLICATIONS

International Search Report (PCT/ISA/210) dated May 12, 2008.

* cited by examiner

*Primary Examiner* — Susan W Berman
(74) *Attorney, Agent, or Firm* — Buchanan Ingersoll & Rooney PC

(57) ABSTRACT

A photosensitive resin composition which is effective in avoiding troubles in the step of plating with various metals in printed wiring board production, such as under-film metal deposition and film peeling, and which forms a wiring-protecting film excellent in adhesion, flexibility, insulation reliability, and heat resistance. The photosensitive resin composition comprises (A) a carboxylated polymer, (B) a compound having at least two photopolymerizable unsaturated double bonds, (C) a photopolymerization initiator, and (D) a nitrogen compound represented by a specific feature.

14 Claims, No Drawings

PHOTOSENSITIVE RESIN COMPOSITION, DRY FILM, AND PROCESSED PRODUCT MADE USING THE SAME

TECHNICAL FIELD

The present invention relates to a photosensitive resin composition, a dry film, and a processed product made using the same.

BACKGROUND ART

In recent years, conductive circuit patterns on printed wiring boards are becoming finer and finer with increasing positional accuracy; furthermore, surface-mounted components are becoming smaller. This trend promoted the widespread use of photosensitive resin composition-based photolithography in the manufacture of printed wiring boards. Resin compositions which contain epoxy compounds as one of photosensitive resins (see Patent Documents 1 and 2) have been widely used as materials of solder resists that serve as permanent protection films for metal interconnections. Moreover, resist compositions containing carboxyl group-containing binder polymers have been widely used for the manufacture of interconnections (see Patent Document 3).

Either of the above resin compositions is used during metal plating as a material for masking portions where plating is not intended. However, recent studies indicate that these masking materials are less durable under stringent metal plating conditions. Thus, demand has particularly arisen for materials which are durable enough to be capable of being used under stringent metal plating conditions, such as electroless gold plating condition where plating is conducted under acidic condition at elevated temperatures (70° C. or higher), electroless tin plating condition where plating is conducted under strong acid condition, etc.

It is reported that an excellent electroless plating layer can be obtained by providing an additional photosensitive resin composition layer on a solder resist followed by plating and removal of the photosensitive resin layer (see Patent Document 4). However, it is not industrially desirable to provide such a protection layer only for the purpose of achieving electroless plating. Thus, there is a strong demand for materials with high plating resistance.

Photosensitive resins with excellent insulating property and excellent metal adhesion have also been required. To meet this requirement, technologies have been suggested by which adhesion of photosensitive resins, which contain polyimide resin and polybenzoxazole resin as highly-insulating resins, to metal interconnections is improved (see Patent Document 5). However, while photosensitive resins obtained with these technologies can be developed by unstable aqueous solutions of organic base compounds, they cannot be developed at all with low-concentration alkali metal aqueous solutions—typical developers used in the manufacture of printed wiring boards. For this reason, these photosensitive resins may be disadvantageous in industrial uses.

Patent Document 1: International Application Publication No. WO02/24774
Patent Document 2: International Application Publication No. WO03/059975
Patent Document 3: Japanese Patent Application Laid-Open No. 2000-321767
Patent Document 4: Japanese Patent Application Laid-Open No. 2006-330193
Patent Document 5: Japanese Patent Application Laid-Open No. 2006-227387

DISCLOSURE OF INVENTION

Problems to be Solved by the Invention

It is therefore an object of the present invention to provide a photosensitive resin composition which is effective in avoiding troubles in the step of plating with various metals in printed wiring board manufacture, such as plating migration and film peeling, and which forms a interconnection protection film excellent in adhesion, flexibility, insulation reliability, and heat resistance.

Means for Solving the Problem

The present invention relates to the following photosensitive resin composition.

[1] A photosensitive resin composition including:
  (A) polyimide precursor;
  (B) compound having at least two photopolymerizable unsaturated double bonds;
  (C) photopolymerization initiator; and
  (D) heterocyclic compound having a substituted or unsubstituted aryl group, the compound having a heterocyclic ring which contains at least one nitrogen atom as an atom constituting the heterocyclic ring.

[2] The photosensitive resin composition according to [1], wherein the heterocyclic ring is a 5-membered ring or a 6-membered ring.

[3] The photosensitive resin composition according to [1], wherein (D) heterocyclic compound is at least one of the compounds represented by the following general formulas (1) to (4).

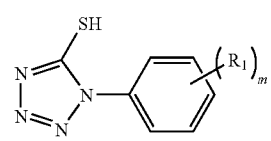

(1)

(where $R_1$ denotes a monovalent organic group, and m denotes an integer of 0-5)

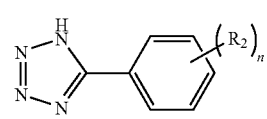

(2)

(where $R_2$ denotes a monovalent organic group, and n denotes an integer of 0-5)

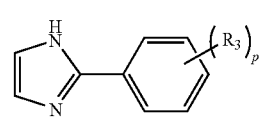

(3)

(where $R_3$ denotes a monovalent organic group, and p denotes an integer of 0-5)

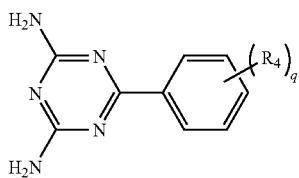

(4)

(where $R_4$ denotes a monovalent organic group, and q denotes an integer of 0-5)

[4] The photosensitive resin composition according to any one of [1] to [3], wherein (D) heterocyclic compound is contained in an amount of 0.01 parts by mass to 10 parts by mass per 100 parts by mass of the solid content of the photosensitive resin composition.

[5] The photosensitive resin composition according to any one of [1] to [4], further including (E) flame retardant in an amount of 1 part by mass to 70 parts by mass per 100 parts by mass of the total of (A) polyimide precursor, (B) compound and (C) photopolymerization initiator.

[6] A dry film produced from a photosensitive resin composition according to any one of [1] to [5].

[7] A processed product including a resin film formed of a dry film according to [6].

[8] The processed product according to [7], wherein the processed product is a printed wiring board.

[9] An electric device including a processed product according to [7].

Advantageous Effects of Invention

With a photosensitive resin composition of the present invention, it is possible to avoid troubles in the step of plating with various metals in printed wiring board manufacture, such as plating migration and film peeling. Furthermore, as the photosensitive resin composition is excellent in adhesion, flexibility, insulation reliability and heat resistance, it is possible to manufacture a printed wiring board having an excellent interconnection protection film.

A photosensitive resin composition of the present invention can be readily provided in the form of dry film, thus contributing to increased printed wiring board productivity and reduced environmental loads.

BEST MODE FOR CARRYING OUT THE INVENTION

Hereinafter, the present invention will be described in detail.

A photosensitive resin composition of the present invention contains (A) carboxyl group-containing polymer. It should be noted that different (A) carboxyl group-containing polymers may be used alone or in combination.

(A) Carboxyl group-containing polymer is preferably a polyimide precursor as polyimide resin exhibits excellent insulating property, etc. However, it should be noted that polymers other than polyimide precursors may be employed as (A) carboxyl group-containing polymer; examples thereof include carboxyl group-containing polymers having as a backbone acrylic resin, styrene resin, epoxy resin, polyamide resin, polyimide resin, polyester resin, polybenzoxazole resin, phenol resin, etc. Acrylic resins can be obtained for instance by radical polymerization, ion polymerization, etc., of an ethylenically unsaturated double bond-containing compound.

Examples of ethylenically unsaturated double bond-containing compounds include styrenes such as styrene, α-methyl styrene, α-ethyl styrene, α-chlorostyrene and α-bromostyrene; acrylic acid; methacrylic acid; (meth)acrylates such as methyl methacrylate, ethyl methacrylate and n-butyl acrylate; maleic acids; acrylonitrile; fumaric acid; and cinnamic acids. Typically, two or more different ethylenically unsaturated double bond-containing compounds are copolymerized in order to control the carboxyl group content.

(A) Carboxyl group-containing polymer may be a polyester resin having a carboxyl group at its side chain.

As described above, preferred examples of (A) carboxyl group-containing polymer are polyamic acids (polyimide precursors) or polyimide resins in which the carboxyl group moiety of polyamic acid is partially esterified. The reason for is that polyimides are excellent in heat resistance, insulating property, flexibility, and adhesion. In particular, polyamic acids are advantageous in industrial uses.

A polyamic acid is a polyimide precursor obtained by reaction between an acid dianhydride (e.g., pyromellitic acid dianhydride) and a diamine (e.g., 1,3-bis(4-aminophenoxy)benzene) in polar organic solvent such as N-methylpyrrolidone.

Examples of acid dianhydrides used as sources of polyimide precursors such as polyamic acids include pyromellitic acid dianhydride, 3,3',4,4'-benzophenonetetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 1,1-bis(2,3-dicarboxylphenyl)ethane dianhydride, 2,2-bis(2,3-dicarboxylphenyl)ethane dianhydride, 2,2-bis(3,3-dicarboxylphenyl)ethane dianhydride, 2,2-bis[4-(3,4-dicarboxyphenoxy)phenyl]propane dianhydride, 4,4'-oxydiphthalic acid dianhydride, 2,3,3',4'-biphenylethertetracarboxylic acid dianhydride, 2,3,5,6-pyridinetetracarboxylic acid dianhydride, 3,4,9,10-perylenetetracarboxylic acid dianhydride, 2,3,3',4'-benzophenonetetracarboxylic acid dianhydride, 3,3',4,4'-benzophenonetetracarboxylic acid dianhydride, and 3,4,3',4'-biphenyltetracarboxylic acid dianhydride. It should be noted that different acid dianhydrides may be used alone or in combination.

For increased compatibility between polyamic acid and other components contained in a photosensitive resin composition of the present invention, preferred examples of acid dianhydrides as sources of polyimide precursors are, for example, pyromellitic acid dianhydride, 4,4'-oxydiphthalic acid dianhydride, 3,3',4,4'-benzophenonetetracarboxylic acid dianhydride and 3,4,3',4'-biphenyltetracarboxylic acid dianhydride, with pyromellitic acid dianhydride, 4,4'-oxydiphthalic acid dianhydride and 3,4,3',4'-biphenyltetracarboxylic acid dianhydride being more preferable, although depending on the composition of other components in the photosensitive resin composition.

Examples of diamines used as sources of polyimide precursors include aromatic diamines such as 3,3'-diaminodiphenylether, 4,4'-diamino-3,3',5,5'-tetramethyldiphenylmethane, 4,4'-diamino-3,3'-diethyl-5,5'-dimethyldiphenylmethane, 4,4'-diaminodiphenyl-2,2'-propane, 4,4'-diaminodiphenylmethane, 3,4'-diaminobenzanilide, 4,4'-diaminobenzanilide, 3,3'-diaminobenzophenone, 4,4'-diaminobenzophenone, 3,3'-diethyl-4,4'-diaminodiphenylether, 3,3'-diethoxy-4,4'-diaminodiphenylmethane, 3,3'-dimethyl-4,4'-diaminodiphenylmethane, 3,3'-dimethyl-4,4'-diaminodiphenylpropane, 3,3'-diethyl-4,4'-diaminodiphenylpropane, 3,3'-dimethyl-5,5'-diethyl-4,4'- diaminodiphenylmethane, 3,3'-dimethoxy-4,4'-diaminodiphenylether, 3,3'-dimethoxy-4,4'-diaminodiphenylmethane, 3,3'-dimethoxy-4,4'-diaminodiphenylsulfone, 3,3'-dimethoxy-4,4'-diaminodiphenylpropane, 3,3'-diethoxy-4,4'-diaminodiphenylpropane, 3,3',5,5'-tetramethyl-4,4'-diaminodiphenylmethane, 3,3',5,5'-tetraethyl-4,4'-diaminodiphenylmethane, polytetramethylene oxide-di-p-aminobenzoate, polyethylene oxide-di-p-aminobenzoate, polypropylene oxide-di-p-aminobenzoate, 4,4'-bis(3-aminophenoxy)biphenyl, 4,4'-bis(4-aminophenoxy)biphenyl, 1,3-bis(3-aminophenoxy)benzene, 1,3-bis(4-aminophenoxy)benzene, 1,4-bis(4-aminophenoxy)benzene, 1,3-bis[3-(aminophenoxy)phenoxy]benzene, bis[4-(4-aminophenoxy)phenyl]ether, and 2,2'-bis[4-(4-aminophenoxy)phenyl]propane.

Additional examples of diamines include polyalkylene glycol diamines represented by the following general formula (5) such as polyethylene glycol diamine, polypropylene glycol diamine and polybutylene glycol diamine; and alkyl diamines such as dodecane diamine and hexamethylene diamine.

$$H_2N\text{—}(R_5O)_n\text{—}R_6\text{—}NH_2 \quad (5)$$

(where $R_5$ and $R_6$ each denote an aliphatic hydrocarbon group having 1-6 carbon atoms, and n denotes an integer of 1-30)

Specific examples of compounds represented by general formula (5) include polyethylene glycol diamine, polypropylene glycol diamine, polytetramethylene glycol diamine, diamines having block copolymers of polyethylene glycol and polypropylene glycol, diamines having block copolymers of polyethylene glycol and polytetramethylene glycol, diamines having block copolymers of polypropylene glycol and polytetramethylene glycol, and diamines having block copolymers of polyethylene glycol, polypropylene glycol and polytetramethylene glycol. In general formula (5), n denotes an integer of 1-30, preferably 2-20. When n is 2 or more, $R_5$s may be identical or different.

Examples of the most preferable diamines as sources of polyimide precursors include 1,3-bis(3-aminophenoxy)benzene, 1,3-bis(4-aminophenoxy)benzene, 1,3-bis[3-(aminophenoxy)phenoxy]benzene, 4,4'-bis(3-aminophenoxy)biphenyl, polypropylene glycol diamine, and polybutylene glycol diamine. It should be noted that different diamines may be used alone or in combination.

Examples of the most preferable carboxyl group-containing polymer contained in a photosensitive resin composition of the present invention include polyimide precursors prepared from diamines selected from 1,3-bis(3-aminophenoxy)benzene, 4,4'-bis(3-aminophenoxy)biphenyl, polypropylene glycol diamine, etc., and acid dianhydrides selected from pyromellitic acid dianhydride, 4,4'-oxydiphthalic acid dianhydride, 3,4,3',4'-biphenyltetracarboxylic acid dianhydride, etc.

The temperature at which a diamine and an acid dianhydride are polymerized for polyamic acid production is typically 10-60° C., preferably 20-55° C. The reaction pressure is not specifically limited. The resultant polyamic acid may be partially imidized. Partially-imidized polyamic acids can be prepared by dehydration at elevated temperature around 100-200° C. for imidization or by catalytic synthesis, for example. The reaction time varies depending on the type of the organic solvent used, reaction time, etc., and the time sufficient for the reaction to complete is typically 4-24 hours.

A photosensitive resin composition of the present invention contains (B) compound having at least two photopolymerizable unsaturated double bonds; examples thereof include compounds having two or more acrylic groups, and compounds having two or more vinyl groups. Specific examples include ethylene glycol di(meth)acrylate, diethylene glycol di(meth)acrylate, triethylene glycol di(meth)acrylate, polyethylene glycol di(meth)acrylate, 1,3-butylene glycol di(meth)acrylate, 1,6-hexanediol di(meth)acrylate, neopentyl di(meth)acrylate, polypropylene glycol di(meth)acrylate, ethylene oxide-modified bisphenol A di(meth)acrylate, ethylene oxide/propylene oxide-modified bisphenol A di(meth)acrylate, tetramethylene oxide-modified bisphenol A di(meth)acrylate, propylene oxide-modified bisphenol A di(meth)acrylate, propylene oxide/tetramethylene oxide-modified bisphenol A di(meth)acrylate, ethylene oxide-modified bisphenol F di(meth)acrylate, ethylene oxide/propylene oxide-modified bisphenol F di(meth)acrylate, tetramethylene oxide-modified bisphenol F di(meth)acrylate, propylene oxide-modified bisphenol F di(meth)acrylate, propylene oxide/tetramethylene oxide-modified bisphenol F di(meth)acrylate, pentaerythritol tri acrylate, pentaerythritol tetraacrylate, trimethylolpropane tri acrylate, trimethylolpropane/propylene oxide-modified triacrylate, isocyanurate ethylene oxide-modified diacrylate, glycerin di(meth)acrylate, urethane acrylates having two or more (meth)acryloyl groups, dipentaerythritol pentaacrylate, dipentaerythritol hexaacrylate, acrylic acid-modified condensates of dipentaerythritol and ε-caprolactone, polyester acrylates, and compounds obtained by modifying epoxy groups of epoxy compounds with acrylic acids.

It should be noted that different (B) compounds having at least two photopolymerizable unsaturated double bonds may be used alone or in combination.

Preferred examples of (B) compounds having at least two photopolymerizable unsaturated double bonds are ethylene oxide-modified bisphenol A di(meth)acrylate, glycerin di(meth)acrylate, urethane acrylates having two or more (meth)acryloyl groups, dipentaerythritol pentaacrylate, dipentaerythritol hexaacrylate, acrylic acid-modified condensates of dipentaerythritol and ε-caprolactone, and polyester acrylates.

The amount of (B) compound in a photosensitive resin composition of the present invention is preferably 3-200 parts by mass, more preferably 5-200 parts by mass, further preferably 10-50 parts by mass, per 100 parts by mass of (A) carboxyl group-containing polymer. By setting the amount of (B) compound to 200 parts by mass or less, non-exposed portions retain solubility enough for development with an alkaline solution and a cured product after imidization retains flexibility.

A photosensitive resin composition of the present invention contains (C) photopolymerization initiator; examples thereof include benzophenone, Michler's ketone, benzoin, benzoin ethyl ether, benzoin butyl ether, benzoin isobutyl ether, 2,2-dimethoxy-2-phenylacetophenone, 2-hydroxy-2-phenylacetophenone, 2-hydroxy-2-methylpropiophenone, 2-hydroxy-4-isopropyl-2-methylpropiophenone, 2-ethylanthraquinone, 2-t-butylanthraquinone, diethylthioxanthone, chlorothioxanthone, benzil, benzyl dimethyl ketal, 1-hydroxycyclohexyl phenyl ketone, benzoylbenzoic acid, 2-methyl-1-(4-methylthiophenyl)-2-morpholinopropane-1-one, and 2-benzyl-2-dimethylamino-1-(4-morpholinophenyl)-butanone-1,2,4,6-trimethylbenzoyldiphenylphosphine oxide.

Additional examples of (C) photopolymerization initiator include 1 mole adduct or 2-4 mole adducts of ethylene oxide to benzoin; 1 mole adduct or 2-4 mole adducts of propylene oxide to benzoin; α-allylbenzoin; mole adduct or 2-4 mole adducts of ethylene oxide to 1-hydroxycyclohexyl phenyl ketone; 1 mole adduct or 2-4 mole adducts of propylene oxide to 1-hydroxycyclohexyl phenyl ketone; 1 mole adduct or 2-4 mole adducts of ethylene oxide to benzoylbenzoic acid; 1 mole adduct or 2-4 mole adducts of propylene oxide to benzoylbenzoic acid; 1 mole adduct or 2-4 mole adducts of ethylene oxide to hydroxybenzophenone; 1 mole adduct or 2-4 mole adducts of propylene oxide to hydroxybenzophenone; 4-(2-hydroxyethoxy)-phenyl-(2-hydroxy-2-propyl)ketone; 4-(2-acryloxyethoxy)-phenyl-(2-hydroxy-2-propyl)ketone; 1 mole adduct or 2-4 mole adducts of ethylene oxide to 4-(2-hydroxyethoxy)-phenyl-(2-hydroxy-2-propyl)ketone; 1 mole adduct or 2-4 mole adducts of propylene oxide to 4-(2-hydroxyethoxy)-phenyl-(2-hydroxy-2-propyl)ketone; 1-(4-isopropylphenyl)-2-hydroxy-2-methylpropane-1-one; and 1-(4-decylphenyl)-2-hydroxy-2-methylpropane-1-one. It should be noted that different (C) photopolymerization initiators may be used alone or in combination.

Preferred examples of (C) photopolymerization initiator include diethylthioxanthone, benzyl dimethyl ketal, 1-hydroxy cyclohexylphenyl ketone, 2-methyl-1-(4-methylthiophenyl)-2-morpholinopropane-1-one, 2-benzyl-2-dimethylamino-1-(4-morpholinophenyl)-butanone-1, and 2,4,6-trimethylbenzoyldiphenylphosphine oxide.

A photosensitive resin composition of the present invention may contain a photopolymerization initiator aid for increased polymerization efficiency. Examples thereof include triethanolamine, diethanolamine, monoethanolamine, tripropanolamine, dipropanolamine, monopropanolamine, dimethylamino ethyl benzoate, and 4-dimethylamino isoamyl benzoate. It should be noted that different photopolymerization initiators may be used alone or in combination.

The amounts of photopolymerization initiator and photopolymerization initiator aid are each 0.05-10 wt %, preferably 0.5-7 wt %, more preferably 0.5-5 wt % based on the solid content of photosensitive resin. By setting the total amount of photopolymerization initiator and photopolymerization initiator aid to 0.1 wt % or more, it is possible to obtain a cured article with a cure degree enough to achieve desired resolution. Moreover, by setting the total amount of photopolymerization initiator and photopolymerization initiator aid to 20 wt % or less, it is possible to moderately adjust the polymerization degree of (B) photopolymerizable compound and thus to control resolution and flexibility.

A photosensitive resin composition of the present invention contains (D) nitrogenous heterocyclic compound, a compound which contains at least one nitrogen atom as an atom constituting the heterocyclic ring and in which the heterocyclic ring has an aryl group. It should be noted that different (D) nitrogenous heterocyclic compounds may be used alone or in combination.

The heterocyclic ring of (D) nitrogenous heterocyclic compound is preferably a 5-membered ring or a 6-membered ring. Examples thereof include tetrazole (6-membered ring), imidazole (5-membered ring), and triazine (6-membered ring).

The aryl group attached to the heterocyclic ring of (D) nitrogenous heterocyclic compound may have a substituent. Examples thereof include hydroxyl, alkyl, alkoxy, formyl, carboxyl, and amide groups. Specific examples include hydroxyl, methyl, t-butyl, methoxy, ethoxy, formyl, carboxyl, and acetoamide groups. A preferred example of the aryl group of the heterocyclic ring is phenyl group.

Preferred examples of (D) nitrogenous heterocyclic compound include compounds represented by the following general formulas (1)-(4).

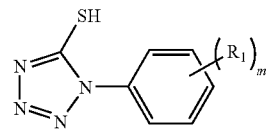

(where $R_1$ denotes a monovalent organic group, and m denotes an integer of 0-5)

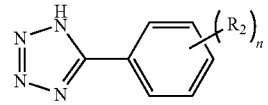

(where $R_2$ denotes a monovalent organic group, and n denotes an integer of 0-5)

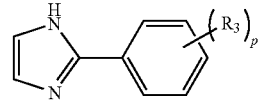

(where $R_3$ denotes a monovalent organic group, and p denotes an integer of 0-5)

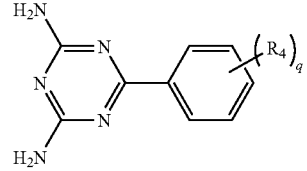

(where $R_4$ denotes a monovalent organic group, and q denotes an integer of 0-5)

Preferred examples of the monovalent organic groups denoted by $R_1$ to $R_4$ in the above general formulas include hydroxyl, alkyl, alkoxy, formyl, carboxyl, and amide groups. More specific examples include hydroxyl, methyl, t-butyl, methoxy, ethoxy, formyl, carboxyl, and acetoamide groups. Preferred numeric ranges of m, n, p and q vary depending on the identity of substituent; however, they preferably denote an integer of 0-3.

Examples of compounds represented by general formula (1) include 5-mercapto-1-phenyltetrazole, 1-(3-methylphenyl)-1H-tetrazole-5-thiol, 1-(4-ethoxyphenyl)-1H-tetrazole-5-thiol, 1-(4-methoxyphenyl)-5-mercaptotetrazole, 1-(4-carboxyphenyl)-5-mercaptotetrazole, and 1-(3-acetoamidephenyl)-5-mercaptotetrazole.

Examples of compounds represented by general formula (2) include 5-phenyltetrazole, 4-(tetrazole-5-yl)benzaldehyde, 5-(4-(t-butyl)phenyl)-2H-1,2,3,4-tetrazole, and 5-(3-t-butyl-4-methoxyphenyl)-2H-tetrazole.

Examples of compounds represented by general formula (3) include 2-(4-chlorophenyl)-1H-imidazole, 2-(4-fluorophenyl)-1H-imidazole, 4-(1H-imidazole-2-yl)benzoic acid, and 2-phenylimidazole.

Examples of compounds represented by general formula (4) include 2,4-diamino-6-phenyl-1,3,5-triazine, 2,4-diamino-6-(m-toluyl)-1,3,5-triazine, 2,4-diamino-6-(2,3-xylyl)-1,3,5-triazine, 4-chlorobenzoquanamine, and 3'-trifluoromethylbenzoquanamine.

More preferred examples of (D) nitrogenous heterocyclic compound are 5-mercapto-1-phenyltetrazole, 5-phenyltetrazole, 2-phenylimidazole, and 2,4-diamino-6-phenyl-1,3,5-triazine.

(D) Nitrogenous heterocyclic compound is preferably contained in such an amount that does not impair the inherent physical properties of the photosensitive resin; it is typically 0.01-10 parts by mass, preferably 0.01-5 parts by mass, per 100 parts by mass of the solid content of the photosensitive resin composition.

A photosensitive resin composition of the present invention may further contain (E) flame retardant in cases where flame retardancy is insufficient. The flame retardant (E) is not specifically limited; however, preferably, it is generally an organic or inorganic compound other than halogen-containing organic compounds and antimony compounds.

Preferred examples of (E) flame retardant include, but not limited to, aluminum hydroxide, magnesium hydroxide, magnesium carbonate, calcium carbonate, graphite, heat-expansive graphite, melamine, phosphates, phosphazene compounds, ammonium phosphate, 9,10-dihydro-9-oxa-10-phosphaphenanthrene-10-oxide adducts, and silicone compounds. Organic compounds containing a phosphorus atom as a constituent atom exhibit higher flame retardancy and thus can attain flame retardancy even at low content level. For this reason, these organic compounds can provide sufficient flame retardancy without impairing the inherent physical properties of the photosensitive resin and thus are more preferable examples of (E) flame retardant.

Desirably, (E) flame retardant is contained in a photosensitive resin composition of the present invention in such an amount that does not impair the inherent physical properties of the photosensitive resin and provides desired flame retardancy. The typical amount of flame retardant (E) is 1-70 parts by mass, preferably 1-50 parts by mass, per 100 parts by mass of the total of (A), (B), and (C) components.

A photosensitive resin composition of the present invention typically contains a solvent, which preferably readily dissolves the above (A)-(E) components partially or entirely. It should be noted, however, that a poor solvent may be added in such an amount that improves or does not impair workability (including drying characteristics) and resin physical properties. The solvent content in the photosensitive resin composition is not specifically limited as long as it improves or does not impair workability (including drying characteristics) and resin's physical properties. A preferred solvent content is 30-90 wt %, preferably 45-70 wt %, based on the weight of the photosensitive resin composition. When the solvent content falls within this range, it results in improved leveling characteristics during dry film production to increase dry film quality.

Examples of the solvent include ketones such as acetone, methyl ethyl ketone, methyl isobutyl ketone, cyclohexanone, cyclopentanone, methyl n-amyl ketone, acetonylacetone, isophorone, and acetophenone; alcohols such as ethyl alcohol, isopropyl alcohol, n-butanol, ethylene glycol, diethylene glycol, triethylene glycol, propylene glycol, and hexylene glycol; ethers such as 1,4-dioxane, trioxane, diethyl acetal, 1,2-dioxolane, diethylene glycol dimethyl ether, and tetrahydrofuran; esters such as ethyl acetate, methyl benzoate, ethylene glycol monomethyl ether acetate, ethylene glycol monoethyl acetate, ethylene glycol monopropyl acetate, ethylene glycol diacetate, propylene glycol monomethyl ether acetate, propylene glycol monoethyl ether acetate, propylene glycol monopropyl ether acetate, propylene glycol monobutyl ether acetate, propylene glycol diacetate, diethylene glycol monomethyl ether acetate, diethylene glycol monoethyl ether acetate, and diethylene glycol diacetate; hydrocarbons such as n-heptane, n-octane, cyclohexane, benzene, toluene, xylene, ethylbenzene, and diethylbenzene; and polar aprotic solvents such as dimethylsulfoxide, N,N-dimethylacetoamide, N,N-dimethylformamide, hexamethylphosphoramide, and N,N'-dimethylimidazolidinone.

Any other solvent may be added in the photosensitive resin composition as long as the effect of the present invention is not impaired. The solvents may be used singly or in combination. For example, use of a mixture of a low-boiling point solvent and a high-boiling point solvent can prevent foaming in the drying process and thus may enhance dry film quality.

A dry film of the present invention can be obtained for instance by applying a photosensitive resin composition in which the solid content has been adjusted to 30-90% by mass onto a colorless transparent carrier film of given thickness to a given thickness, and drying the applied composition.

The colorless transparent carrier film may be a film made of low-density polyethylene, high-density polyethylene, polypropylene, polyester, polyethylene terephthalate, polycarbonate, polyalylate, or ethylene/cyclodecene copolymer (APEL®, Mitsui Chemicals, Inc.). As the physical properties and coating condition of the photosensitive resin composition are susceptible to water content, the carrier film is preferably a resin film with low moisture permeability. Therefore, APEL®, polyethylene terephthalate, polyethylene, and polypropylene are more preferable materials.

The thickness of the carrier film is typically 15-100 µm, preferably 15-75 µm. When the thickness falls within this range, the carrier film exhibits excellent coating properties, adhesion properties, rolling properties, rigidity, and cost effectiveness. In view of achieving these properties, more preferable is a polyethylene terephthalate film with a thickness of 15-100 µm, preferably 15-40 µm.

A cover film for protecting the photosensitive resin composition layer may be attached to a dry film. The cover film is preferably a low-moisture permeability resin film as is the carrier film, but is not necessarily required to be transparent. The cover film also needs to be readily peeled off and, therefore, it is required that the adhesion between the cover film and photosensitive resin layer be smaller than the adhesion between the carrier film and photosensitive resin layer.

Preferably, the cover film is a resin film which is made of APEL®, polyethylene terephthalate, polyethylene or polypropylene and is 5-100 µm in thickness.

Application of a photosensitive resin composition onto a carrier film can be accomplished with a known means such as a reverse roll coater, gravure roll coater, comma coater, or curtain coater. Drying of the resulting coat is accomplished by hot-air drying or with a dryer using far infrared rays or near infrared rays, at a temperature of 50-120° C., preferably 60-100° C., for a period of 2-30 minutes.

After removing the cover film from the dry film manufactured, the dry film is placed onto a circuit surface of a printed wiring board and is then thermally press-bonded by a known method such as plane pressing or roll pressing to form a photosensitive coat film. Press bonding is carried out under pressure of 0.2-3 MPa at elevated temperatures, typically at 40-150° C., preferably at 50-120° C. When a vacuum laminator is employed for the formation of a photosensitive resin layer on a printed wiring board, plugging of the circuit patterns with the photosensitive resin improves.

Herein, an article having a photosensitive coat or the like produced from the above dry film is referred to as a "processed product."

By setting the thermal press bonding-permitting temperature to 40° C. or higher, alignment operations before press bonding are free from any troubles attributable to tackiness. By setting this temperature to 150° C. or lower, it is possible to prevent excessive curing of the photosensitive resin to provide enough time for press bonding, whereby a process margin can be widely taken. The thermal press bonding-permitting temperature means a temperature at which resin can sufficiently plugs patterns without causing problems of remaining voids and the resultant photosensitive resin film can be controlled so as to have such a viscosity that the resin does not flow out of the patterns.

The laminated dry film is then exposed through a desired patterned photomask and developed, and microholes and fine lines can be generated in the photosensitive resin layer on the printed wiring board. Examples of active energy beams used for exposure include electron beams, ultraviolet ray and X-ray, with ultraviolet ray being preferable. As a light source, it is possible to use a low-pressure mercury lamp, high-pressure mercury lamp, extra-high-pressure mercury lamp, halogen lamp, etc. The exposure dose is typically 100-1,000 mJ/cm$^2$.

After the exposure, the dry film is developed to remove non-exposed portions. Development is carried out by, for example, an immersion method or spraying method. As a developer, alkali aqueous solution (e.g., sodium hydroxide aqueous solution or sodium carbonate aqueous solution) is employable. After the development, the dry film is generally rinsed with water to remove remaining developer. Before water rinsing, developer components may be removed with a dilute acid aqueous solution.

After the development and water washing, the patterned photosensitive resin may be cured by heat treatment to serve as a permanent protection film. The heat treatment is carried out continuously or stepwise at 140-450° C., preferably at 150-250° C. for 0.1-5 hours.

EXAMPLES

Hereinafter, the present invention will be described in more detail with reference to representative Examples, which however shall not be construed as limiting the scope of the invention thereto. The following sample evaluations were made in Examples and Comparative Examples.

(1) Coat Formability

It was confirmed whether a transparent film can be obtained from a photosensitive resin composition varnish applied onto a 19 μm-thick polyethylene terephthalate film with a coater at a gap of 100 μm between the coater and polyethylene terephthalate film.

(2) Development Capability

A dry film obtained was bonded to metal surface and exposed through a photomask (hole diameter=200 μm) with an exposure device equipped with a high-pressure mercury lamp (ORC MANUFACTURING CO., LTD) at a dose of 100 mJ/cm$^2$. The exposed dry film was sprayed with 30° C. 1% sodium carbonate aqueous solution for 60 seconds at a spray pressure of 0.2 MPa. It was confirmed whether non-exposed portions of photosensitive resin have been developed away.

(3) Adhesion Test

A dry film obtained was bonded to metal surface and exposed through a photomask (hole diameter=200 μm) with an exposure device equipped with a high-pressure mercury lamp (ORC MANUFACTURING CO., LTD) at a dose of 100 mJ/cm$^2$. The exposed dry film was sprayed with 30° C. 1% sodium carbonate aqueous solution for 60 seconds at a spray pressure of 0.2 MPa. The dry film was heated at 230° C. for 20 minutes to fabricate a test piece. The test piece was evaluated in accordance with JIS K 5404.

Appearance after Electroless Ni Plating

A dry film obtained was bonded to metal surface and exposed through a photomask (hole diameter=200 μm) with an exposure device equipped with a high-pressure mercury lamp (ORC MANUFACTURING CO., LTD) at a dose of 100 mJ/cm$^2$. The exposed dry film was sprayed with 30° C. 1% sodium carbonate aqueous solution for 60 seconds at a spray pressure of 0.2 MPa. The dry film was heated at 230° C. for 20 minutes to fabricate a test piece.

The test piece was immersed in 40° C. acidic degreasing solution ("ICP Clean S-135" from Okuno Chemical Industries Co., Ltd.) for 4 minutes and rinsed with water. The test piece was then immersed in 14.4 wt % ammonium persulfate aqueous solution at room temperature for 3 minutes and rinsed with water. Thereafter, the test piece was immersed in 10 vol % sulfuric acid aqueous solution for 1 minute at room temperature and rinsed with water. The test piece was then immersed in 25° C. 4% hydrochloric acid aqueous solution for 30 seconds, immersed in catalytic solution ("ICP Accela" from Okuno Chemical Industries Co., Ltd.) for 1 minute, and rinsed with pure water. The test piece was plated with nickel by immersion in 0° C. electroless nickel plating solution ("ICP Nicoron GM-SD" from Okuno Chemical Industries Co., Ltd., pH=4.6) for 15 minutes and rinsed with water. The appearance of the test sample was observed for defects with a stereoscopic microscope at 40× magnification.

Synthesis Example 1

Synthesis of Polyimide Precursor (PAA-1)

In a 3 L-separable flask fitted with a stirrer, reflux condenser, and nitrogen inlet, 49.2 g 1,3-bis(3-aminophenoxy)benzene (Mitsui Chemicals, Inc.) was dissolved in 163.2 g N,N-dimethylacetoamide (Daicel Chemical Industries, Ltd.) in nitrogen gas atmosphere, and the internal temperature was raised to 50° C. Maintaining this temperature, 50.9 g oxydiphthalic acid dianhydride (MANAC Incorporated) was gradually added in the form of dry solid. The mixture was stirred for 20 hours in nitrogen gas atmosphere to produce a polyamic acid solution with a solid content of 38 wt %.

Synthesis Example 2

Synthesis of Polyimide Precursor (PAA-2)

A 500 L-separable flask fitted with a stirrer, reflux condenser, dropping funnel, and nitrogen inlet was charged with 15.3 g pyromellitic acid dianhydride (Daicel Chemical Industries, Ltd.) and 62.1 g N,N-dimethylacetoamide (Daicel Chemical Industries, Ltd.) in nitrogen gas atmosphere. The internal temperature was raised to 50° C. with stirring. At this temperature, 6.36 g polypropylene glycol diamine ("JEFFAMINE D400" from Sun Techno Chemical Co., Ltd.) was added dropwise over 2 hours through the dropping funnel. After addition, stirring was continued for 1 hour at that temperature. The mixture was cooled to below 30° C., and 16.4 g 1,3-bis(3-aminophenoxy)benzene (Mitsui Chemicals, Inc.) was added. The mixture was then stirred for 20 hours in nitrogen gas atmosphere to produce a polyamic acid solution with a solid content of 38 wt %.

Synthesis Example 3

Synthesis of Polyimide Precursor (PAA-3)

A 500 L-separable flask fitted with a stirrer, reflux condenser, dropping funnel, and nitrogen inlet was charged with 28.8 g 3,3',4,4'-biphenyltetracarboxylic acid dianhydride (Mitsui Chemicals, Inc.) and 99.0 g N,N-dimethylacetoamide (Daicel Chemical Industries, Ltd.) in nitrogen gas atmosphere. The internal temperature was raised to 50° C. with stirring. At this temperature, 8.91 g JEFFAMINE D400 (Sun Techno Chemical Co., Ltd.) was gradually added dropwise over 1 hour through the dropping funnel. After addition, stirring was continued for 1 hour at that temperature. The mixture was cooled to below 30° C., and 22.9 g 1,3-bis(3-aminophenoxy)benzene (Mitsui Chemicals, Inc.) was added. The mixture was then stirred for 20 hours in nitrogen gas atmosphere to produce a polyamic acid solution with a solid content of 38 wt %.

Synthesis Example 4

Synthesis of Acrylic Resin (PAA-4)

A 500 mL three-necked flask fitted with a condenser, thermometer, and stirrer was charged with 35 g methyl methacrylate purified by distillation, 50 g methacrylic acid, 25 g ethyl acrylate, 1.7 g azobisisobutyronitrile, and 180 g ethylene glycol monoethyl ether. The internal temperature was raised to 70° C. with stirring, and stirring was continued for 90 minutes at this temperature. By cooling the mixture to room temperature, a colorless, transparent carboxyl group-containing acrylic resin solution was obtained.

Example 1

Production of Photosensitive Resin Composition and Dry Film

At around 21° C., to 263 g polyimide precursor (PAA-1) was added: 80 g bismethacrylate which is a reaction product between polyethylene glycol (n=4.5) monomethacrylate and diphenylmethanediisocyanate (MDI) ("Blenmer DP403AU" from NOF Corporation), and 20.0 g glycerin dimethacrylate ("Blenmer GMR-H" from NOF Corporation) as (B) components; 45.5 g N,N'-dimethylacetoamide (Wako Pure Chemical Industries); 8.0 g 2,4,6-trimethylbenzoyldiphenylphosphine oxide ("SPEEDCURE-TPO" from Nihon Siebel Hegner K.K of Japan) and 2.0 g diethylthioxanthone ("DETX-S" from Nihon Kayaku Tokyo Co., Ltd.) as photopolymerization initiators; 4.0 g ethyl p-dimethylaminobenzoate (Nihon Kayaku Tokyo Co., Ltd.) as a photopolymerization initiator aid; 31.0 g aromatic phosphate flame retardant ("CR-747" from Daihachi Chemical Industry Co., Ltd.); and 0.7 g 2,4-diamino-6-phenyl-1,3,5-triazine. The mixture was stirred for 5 hours to produce a brown viscous liquid (varnish).

The evaluations described above were conducted using the obtained varnish. As a result, a transparent dry film was successfully obtained, and 200 μm-diameter hole development was possible. In addition, adhesion and appearance after electroless Ni plating were not impaired.

Examples 2-14, and Comparative Examples 1-6

As in Example 1, dry films were produced from varnishes prepared in accordance with the formulations shown in Tables 1-3 and then evaluated.

TABLE 1

|  | Ex. 1 | Ex. 2 | Ex. 3 | Ex. 4 | Ex. 5 | Ex. 5 | Ex. 6 |
| --- | --- | --- | --- | --- | --- | --- | --- |
| Polyimide precursor (PAA-1) | 58.2 | 58.2 | 58.2 | 58.2 | 58.2 | 58.2 | 58.2 |
| Blenmer DP403AU | 17.7 | 17.7 | 17.7 | 17.7 | 17.7 | 17.7 | 17.7 |
| Blenmer GMR-H | 4.4 | 4.4 | 4.4 | 4.4 | 4.4 | 4.4 | 4.4 |
| N,N'-dimethylacetoamide | 10.1 | 10.1 | 10.1 | 10.1 | 10.1 | 10.1 | 10.1 |
| Diethylthioxanthone | 0.9 | 0.9 | 0.9 | 0.9 | 0.9 | 0.9 | 0.9 |
| SPEEDCURE TPO | 3.6 | 3.6 | 3.6 | 3.6 | 3.6 | 3.6 | 3.6 |
| p-dimethylaminoethyl benzoate | 1.8 | 1.8 | 1.8 | 1.8 | 1.8 | 1.8 | 1.8 |
| CR-747 | 6.9 | 6.9 | 6.9 | 6.9 | 6.9 | 6.9 | 6.9 |
| 2,4-diamino-6-phenyl-1,3,5-triazine | 0.2 |  |  |  | 0.6 | 1.2 | 2.0 |
| 5-phenyltetrazole |  | 0.2 |  |  |  |  |  |
| 5-mercapto-1-phenyltetrazole |  |  | 0.2 |  |  |  |  |
| 2-phenylimidazole |  |  |  | 0.2 |  |  |  |
| Coat formability | Good | Good | Good | Good | Good | Good | Good |
| Development capability | Good | Good | Good | Good | Good | Good | Good |
| Adhesion | Good | Good | Good | Good | Good | Good | Good |
| Appearance after electroless Ni plating | Good | Good | Good | Good | Good | Good | Good |

TABLE 2

|  | Ex. 7 | Ex. 8 | Ex. 9 | Ex. 10 | Ex. 11 | Ex. 12 | Ex. 13 | Ex. 14 |
| --- | --- | --- | --- | --- | --- | --- | --- | --- |
| Polyimide precursor (PAA-1) | 58.2 | 58.2 | 58.2 | 58.2 | 58.2 |  |  |  |
| Polyimide precursor (PAA-2) |  |  |  |  |  | 58.2 |  |  |
| Polyimide precursor (PAA-3) |  |  |  |  |  |  | 58.2 |  |
| Acryl resin (PAA-4) |  |  |  |  |  |  |  | 58.2 |
| Blenmer DP403AU | 17.7 | 17.7 | 17.7 | 17.7 | 17.7 | 17.7 | 17.7 | 17.7 |
| Blenmer GMR-H | 4.4 | 4.4 | 4.4 | 4.4 | 4.4 | 4.4 | 4.4 | 4.4 |
| N,N'-dimethylacetoamide | 10.1 | 10.1 | 10.1 | 10.1 | 10.1 | 10.1 | 10.1 | 10.1 |
| Diethylthioxanthone | 0.9 | 0.9 | 0.9 | 0.9 | 0.9 | 0.9 | 0.9 | 0.9 |
| SPEEDCURE TPO | 3.6 | 3.6 | 3.6 | 3.6 | 3.6 | 3.6 | 3.6 | 3.6 |
| p-dimethylaminoethyl benzoate | 1.8 | 1.8 | 1.8 | 1.8 | 1.8 | 1.8 | 1.8 | 1.8 |

TABLE 2-continued

|  | Ex. 7 | Ex. 8 | Ex. 9 | Ex. 10 | Ex. 11 | Ex. 12 | Ex. 13 | Ex. 14 |
|---|---|---|---|---|---|---|---|---|
| CR-747 | 6.9 | 6.9 | 6.9 | 6.9 | 6.9 | 6.9 | 6.9 | 6.9 |
| 2,4-diamino-6-phenyl-1,3,5-triazine | 0.2 | 0.4 | 0.6 | 1.4 | 3.4 | 0.2 | 0.2 | 0.2 |
| 5-phenyltetrazole | | | | | | | | |
| 5-mercapto-1-phenyltetrazole | | | | | | | | |
| 2-phenylimidazole | 0.2 | 0.2 | 0.2 | 0.2 | 0.2 | | | |
| Coat formability | Good | Good | Good | Good | Good | Good | Good | Good |
| Development capability | Good | Good | Good | Good | Good | Good | Good | Good |
| Adhesion | Good | Good | Good | Good | Good | Good | Good | Good |
| Appearance after electroless Ni plating | Good | Good | Good | Good | Good | Good | Good | Good |

TABLE 3

|  | Comp. Ex. 1 | Comp. Ex. 2 | Comp. Ex. 3 | Comp. Ex. 4 | Comp. Ex. 5 | Comp. Ex. 6 |
|---|---|---|---|---|---|---|
| Polyimide precursor (PAA-1) | 58.2 | 58.2 | 58.2 | 58.2 | 58.2 | 58.2 |
| Blenmer DP403AU | 17.7 | 17.7 | 17.7 | 17.7 | 17.7 | 17.7 |
| Blenmer GMR-H | 4.4 | 4.4 | 4.4 | 4.4 | 4.4 | 4.4 |
| N,N'-dimethylacetamide | 10.1 | 10.1 | 10.1 | 10.1 | 10.1 | 10.1 |
| Diethylthioxanthone | 0.9 | 0.9 | 0.9 | 0.9 | 0.9 | 0.9 |
| SPEEDCURE TPO | 3.6 | 3.6 | 3.6 | 3.6 | 3.6 | 3.6 |
| p-dimethylaminoethyl benzoate | 1.8 | 1.8 | 1.8 | 1.8 | 1.8 | 1.8 |
| CR-747 | 6.9 | 6.9 | 6.9 | 6.9 | 6.9 | 6.9 |
| 2-amino-1H-1,2,4-triazole | 0.2 | | | | | |
| 3-mercapto-1,2,4-triazole | | 0.2 | | | | |
| 1,2,3-benzotriazole | | | 0.2 | | | |
| 2-vinyl-4,6-diamino-1,3,5-triazine | | | | 0.2 | | |
| 2-amino-5-mercapto-1,3,4-thiadiazole | | | | | 0.2 | |
| Ethyl 2-(4,6-diamino-1,3,5-triazine-2-yl) | | | | | | 0.2 |
| Coat formability | Good | Good | Good | Bad | Good | Bad |
| Development capability | Bad | Good | Good | — | Good | — |
| Adhesion | — | Bad | Good | — | Good | — |
| Appearance after electroless Ni plating | — | — | Sepration occurred | — | Sepration occurred | — |

The dry film prepared in Example 1 was tested for solder heat resistance, bending durability, and plating migration resistance.

After peeling off the cover film, the dry film was placed onto respective boards for evaluation. After alignment, the dry film was bonded by pressing with a vacuum laminator ("MVLP 600" from Meiki Co., Ltd.) for 60 seconds (press temperature=80° C., pressure=0.5 MPa).

The dry film was exposed to UV light at a dose of 600 mJ/cm$^2$ and sprayed with 30° C. 1.0% Na$_2$CO$_3$ aqueous solution at a pressure of 0.20 Pa to develop away non-exposed portions. After water rinsing and drying, the processed product was placed in a circulating hot air oven for 20 minutes for heat curing.

No defects were observed on the cured surface even after having been floated in a 260° C. solder bath, confirming that the processed product has heat resistance sufficient as a general printed wiring board.

The processed product was tested for bending durability in accordance with JIS C6471. The test board employed is a two-layered substrate which consists of a 25 μm-thick polyimide layer and a 18 μm-thick copper layer and has a 50 μm pitch line/space circuit pattern. The test was conducted under the following condition: R=0.38; load=500 g; and rate=175 bends/min. The average value found for the bending durability test was 253, confirming that the processed product exhibited sufficient flexibility.

A polyimide board with a 9 μm-thick comb-shaped copper circuit with a 35 μm pitch line/space pattern was employed. 30 VDC was applied for 1,000 hours at 85° C. and 85% RH to confirm the occurrence of short circuits due to insulation deterioration. Even after 1,000-hour VDC application, the processed product was free from defects and thus exhibited high insulation reliability.

The present application claims the priority of Japanese Patent Application No. 2007-113664 filed on Apr. 24, 2007, the entire contents of which are herein incorporated by reference.

INDUSTRIAL APPLICABILITY

As described above, the photosensitive resin composition of the present invention is effective in avoiding troubles in the step of plating with various metals in printed wiring board manufacture, such as plating migration and film peeling, and is capable forming a interconnection protection film excellent in adhesion, flexibility, insulation reliability, and heat resistance.

The invention claimed is:

1. A photosensitive resin composition comprising:
(A) polyamic acid which is condensed product of an acid dianhydride with a diamine selected from the group consisting of 1,3-bis(3-aminophenoxy)benzene, 1,3-bis(4-aminophenoxy)benzene, 1,3-bis[3-(aminophenoxy)phenoxy]benzene, 4,4'-bis(3-aminophenoxy)biphenyl, and a compound represented by the following formula (5);

$$H_2N-(R_5O)_n-R_6-NH_2 \qquad (5)$$

wherein $R_5$ and $R_6$ each denote an aliphatic hydrocarbon group having 1-6 carbon atoms, and n denotes an integer of 1-30, (B) compound having at least two photopolymerizable unsaturated double bonds;
(C) photopolymerization initiator; and
(D) heterocyclic compound being at least one of compounds represented by the following general formulae (2) and (4):

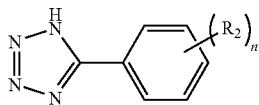
(2)

wherein $R_2$ denotes a monovalent organic group, and n denotes an integer of 0-5,

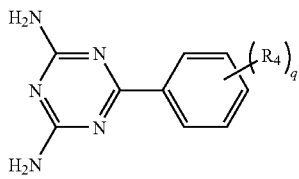
(4)

wherein $R_4$ denotes a monovalent organic group, and q denotes an integer of 0-5.

2. The photosensitive resin composition according to claim 1, wherein (D) heterocyclic compound is contained in an amount of 0.01 parts by mass to 10 parts by mass per 100 parts by mass of a solid content of the photosensitive resin composition.

3. The photosensitive resin composition according to claim 1, further comprising (E) flame retardant in an amount of 1 part by mass to 70 parts by mass per 100 parts by mass of the total of (A) polyamic acid, (B) compound and (C) photopolymerization initiator.

4. A dry film obtained by drying the photosensitive resin composition according to claim 1.

5. A processed product comprising an article obtained by curing the dry film according to claim 4.

6. The product according to claim 5, wherein the product is a printed wiring board.

7. An electric device comprising the product according to claim 5.

8. A photosensitive resin composition comprising:
(A) polyimide precursor;
(B) compound having at least two photopolymerizable unsaturated double bonds;
(C) photopolymerization initiator; and
(D) heterocyclic compound being at least one of compounds represented by the following general formula (1) and (3):

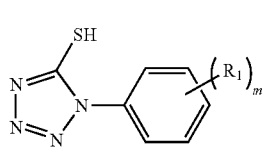
(1)

wherein $R_1$ denotes a monovalent organic group, and m denotes an integer of 0-5,

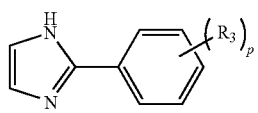
(3)

wherein $R_3$ denotes a monovalent organic group, and p denotes an integer of 0-5.

9. The photosensitive resin composition according to claim 8, wherein (D) heterocyclic compound is contained in an amount of 0.01 parts by mass to 10 parts by mass per 100 parts by mass of a solid content of the photosensitive resin composition.

10. The photosensitive resin composition according to claim 8, further comprising (E) flame retardant in an amount of 1 part by mass to 70 parts by mass per 100 parts by mass of the total of (A) polyimide precursor, (B) compound and (C) photopolymerization initiator.

11. A dry film obtained by drying the photosensitive resin composition according to claim 8.

12. A processed product comprising an article obtained by curing the dry film according to claim 11.

13. The product according to claim 12 wherein the product is a printed wiring board.

14. An electric device comprising the product according to claim 12.

* * * * *